(12) United States Patent
Iijima (10) Patent No.: US 9,132,633 B2
(45) Date of Patent: Sep. 15, 2015

(54) INK JET HEAD

(71) Applicants: KABUSHIKI KAISHA TOSHIBA, Tokyo (JP); TOSHIBA TEC KABUSHIKI KAISHA, Tokyo (JP)

(72) Inventor: Tomomi Iijima, Mishima Shizuoka (JP)

(73) Assignees: Kabushiki Kaisha Toshiba, Tokyo (JP); Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/618,502

(22) Filed: Feb. 10, 2015

(65) Prior Publication Data

US 2015/0224764 A1 Aug. 13, 2015

(30) Foreign Application Priority Data

Feb. 13, 2014 (JP) ................... 2014-025134

(51) Int. Cl.
*B41J 2/14* (2006.01)
*H05K 7/20* (2006.01)

(52) U.S. Cl.
CPC ............... *B41J 2/14* (2013.01); *H05K 7/20436* (2013.01)

(58) Field of Classification Search
CPC .... B41J 2/155; B41J 2202/08; B41J 2202/20; B41J 2202/19; B41J 2002/14362; B41J 2/14024; B41J 2/1408

USPC .......................................... 347/42, 45, 49, 55
See application file for complete search history.

(56) References Cited

U.S. PATENT DOCUMENTS

| 6,739,701 | B2* | 5/2004 | Silverbrook | 347/49 |
| 7,766,448 | B2* | 8/2010 | Ito | 347/20 |
| 7,789,497 | B2* | 9/2010 | Taira et al. | 347/71 |

FOREIGN PATENT DOCUMENTS

| JP | 2005-329551 A | 12/2005 |
| JP | 2006-142841 A | 6/2006 |

* cited by examiner

*Primary Examiner* — An Do
(74) *Attorney, Agent, or Firm* — Patterson & Sheridan, LLP (57) ABSTRACT

An ink jet head includes a head body having a plurality of ejection ports disposed in a nozzle disposition direction and a fluid chamber for ink, a base portion having an ink supply channel and an ink discharge channel communicating with the fluid chamber, a drive circuit configured to drive the head body for ejection, a heat sink configured to radiate heat generated by the drive circuit, a reference plate having both end portions thereof in a plate length direction configured to be fixed to a structure member on a printer body, and a plate holder that has a thermal conductivity lower than a thermal conductivity of the reference plate, positions the head body to cause the nozzle disposition direction thereof to be parallel to a main scanning direction with respect to the reference plate, and couples the heat sink and the base portion to each other.

20 Claims, 8 Drawing Sheets

INK JET HEAD

CROSS-REFERENCE TO RELATED APPLICATION

This application is based upon and claims the benefit of priority from Japanese Patent Application No. 2014-025134, filed Feb. 13, 2014, the entire contents of which are incorporated herein by reference.

FIELD

Embodiments described herein relate generally to an ink jet head.

BACKGROUND

An ink jet printer body includes an ink jet head, which ejects ink toward paper. One type of ink jet recording apparatus includes a plurality of head bodies arranged in a paper width direction or a paper length direction. In such an apparatus, a position of an ejection port at an end portion where a head body is adjacent to another head body is adjusted. The plurality of head bodies are positioned with respect to a printer body to cause each row of ejection ports to be parallel to a main scanning direction, thereby obtaining an image recording region. An ink jet structure member supporting the head bodies is attached to an attachment plate on the printer body side via a reference plate, and the plurality of head bodies are disposed to be parallel to each other with respect to a position of the reference plate. Nevertheless, if a coefficient of thermal expansion of the reference plate is not considered, with respect to driving the head bodies for ejection, the head bodies and the ink jet structure member thermally expand due to heat generated by a driver integrated circuit (IC). An ink jet printer should prevent deterioration in quality of printing due to an occurrence of relative misalignment or an occurrence of thermal distortion between the heads adjacent to each other caused by thermal expansion thereof when a plurality of the heads are arranged in a longitudinal direction.

When the coefficient of thermal expansion of the reference plate is greater than a coefficient of thermal expansion of the attachment plate, an elongated portion of the reference plate in the longitudinal direction becomes greater than an elongated portion of the attachment plate.

DETAILED DESCRIPTION

In general, according to one embodiment, an ink jet head includes: a head body including a plurality of ejection ports and a fluid chamber for ink, the plurality of ejection ports being disposed in a nozzle disposition direction; a base portion including an ink supply channel and an ink discharge channel communicating with the fluid chamber; at least one drive circuit disposed in the base portion and configured to drive the head body for ejection; at least one heat sink configured to radiate heat generated by the at least one drive circuit; a reference plate having both end portions in a plate length direction configured to be fixed to a structure member on a printer body, the reference plate configured to dissipate heat generated by the at least one heat sink and the at least one drive circuit; and a plate holder that has a thermal conductivity lower than a thermal conductivity of the reference plate, positions the head body to cause the nozzle disposition direction thereof to be parallel to a main scanning direction with respect to the reference plate, and couples the at least one heat sink and the base portion to each other.

When a coefficient of thermal expansion of a reference plate is greater than a coefficient of thermal expansion of an attachment plate, an elongated amount of the reference plate in a longitudinal direction becomes greater than an elongated amount of the attachment plate. Thus, the reference plate itself is deformed, and misalignment by an intolerable measurement occurs with respect to a nozzle pitch.

Hereinafter, embodiments of an ink jet head will be described with reference to FIGS. 1 to 8. In the drawings, the same reference numerals and signs are applied to the same elements, and descriptions thereof will not be repeated.

Figure 1:
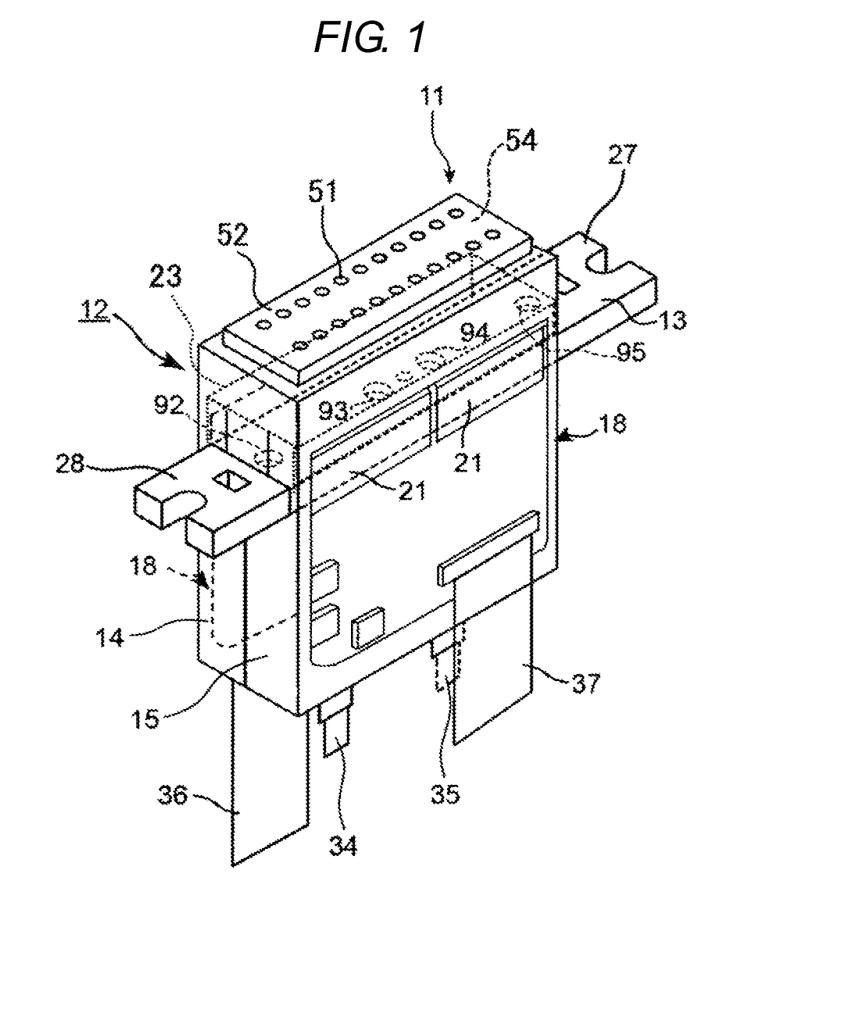
FIG. 1 is a perspective view of an ink jet head according to an embodiment.

FIG. 1 is a perspective view of an ink jet head according to an embodiment. The ink jet head according to the embodiment includes a head body 11 that has a plurality of ejection ports 51 disposed in a nozzle disposition direction and a fluid chamber for ink; a base portion 12 that has an ink supply channel and an ink discharge channel for the head body 11 with respect to the fluid chamber; and a pair of drive circuits 18 that are provided in the base portion 12 and include a driver IC 21 that drives the head body 11 for ejection. The ink jet head also includes a pair of heat sinks 14 and 15 that radiate heat generated by the pair of drive circuits 18; a reference plate 13 to which heat generated by the heat sinks 14 and 15 and the drive circuits 18 is transferred and of which both end portions in a plate length direction are fixed onto an attachment plate 40 (FIG. 5) on a printer body side; and a plate holder 23 (a body-to-be-fixed) that has thermal conductivity lower than the thermal conductivity of the reference plate 13. The plate holder 23 positions the head body 11 to cause the nozzle disposition direction thereof to be parallel to a main scanning direction with respect to the reference plate 13, and couples the heat sinks 14 and 15 and the base portion 12 to each other.

The head body 11 is an ink jet head body configured to eject an ink and includes an orifice plate 52 that has two rows of the ejection ports (nozzle holes) 51, and a frame member that supports the orifice plate 52 from below. A lower portion of the frame member adheres to an upper surface of a base plate 54 inside the base portion 12. A space is formed by the frame member, the base plate 54, and the orifice plate 52. A fluid chamber for ink is formed in the space. The space is provided with a plurality of pressure chambers; the common fluid chamber that is used in common by the pressure chambers; a plurality of piezoelectric elements that changes the capacity of the chamber for each pressure chamber; and nozzles provided between the pressure chambers and the ejection ports 51 for each piezoelectric element.

Figure 2:
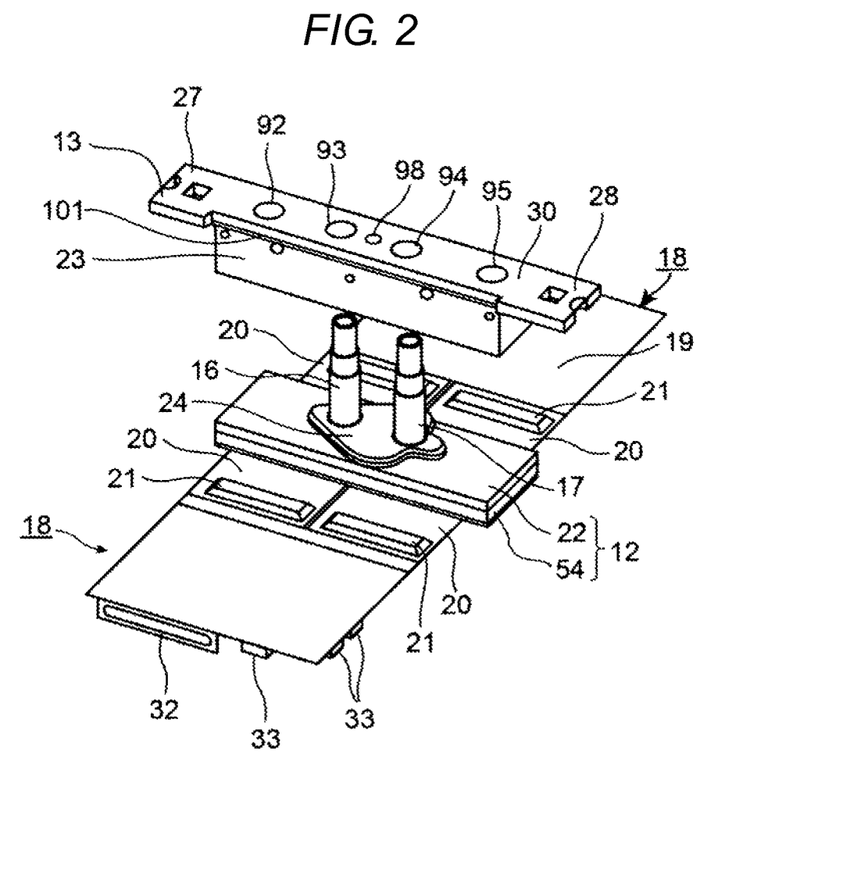
FIG. 2 is a partially exploded perspective view of the ink jet head according to the embodiment.

FIG. 2 is a partially exploded perspective view of the ink jet head according to the embodiment and illustrates the view in an upside down manner with respect to the example in FIG. 1. The aforementioned reference numerals indicate the same elements thereof. The base portion 12 includes the base plate 54 in which a groove for supplying an ink is formed on a plate surface thereof, and a manifold 22 that has an inner ink supply channel and an inner ink discharge channel. The manifold 22 defines a divergence portion and a convergence portion of ink flow channels, and is bonded to the other surface of the base plate 54. A supply pipe 16 that communicates with the inner ink supply channel, and a discharge pipe 17 that communicates with the inner ink discharge channel, adhere to the manifold 22 via a member 24. The supply pipe 16 and the discharge pipe 17 are connected to tubes.

The base plate 54 is interposed between the pair of drive circuits 18 which are symmetrically provided with respect to the base plate 54. The drive circuits 18 electrically transmit and receive control signals with respect to the printer body side to drive the plurality of piezoelectric elements. Each of the drive circuits 18 includes a rigid printed circuit board (PCB) 19, two heat-resistant flexible printed circuit boards (FPC) 20, and the plurality of drive-controlling driver ICs (Dr. IC) 21. For example, the flexible printed circuit board 20 is a polyimide film circuit. One end portion of the flexible printed circuit board 20 is connected to the rigid printed circuit board 19, and the other end portion thereof is connected to a signal line pattern wired inside the base plate 54 and leading to each pressure chamber. The driver ICs 21 are packaged on the flexible printed circuit board 20 using a chip-on-film (COF) technique. The driver ICs 21 are able to respectively apply pulse voltages to a plurality of electrodes inside the common fluid chamber. On the rigid printed circuit board 19, each of the drive circuits 18 includes a connector 32 leading to a controller on the printer body side, passive components 33, and the like.

Figure 3:
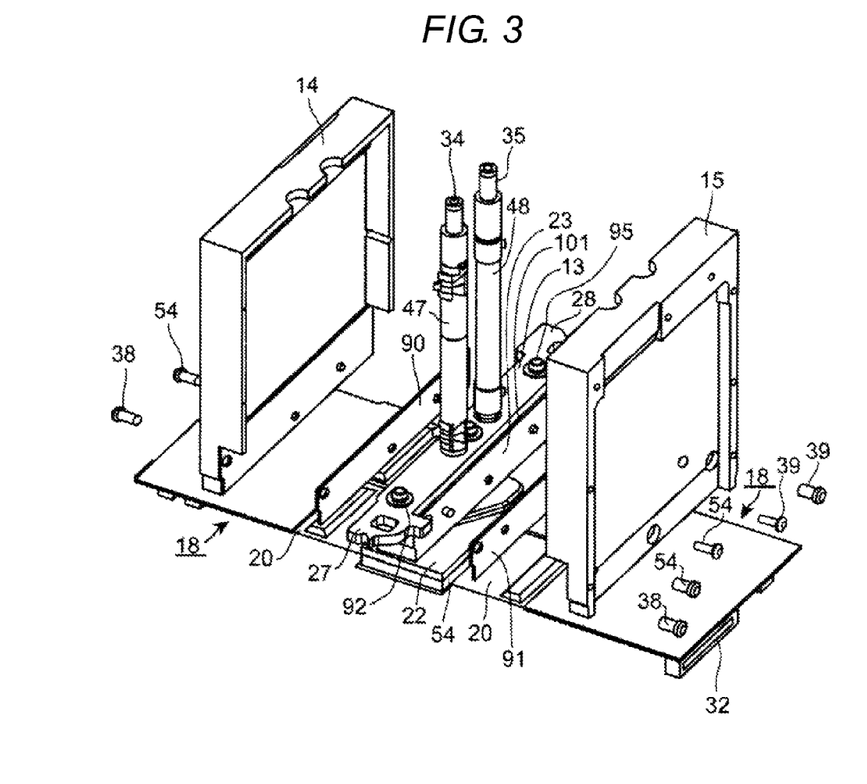
FIG. 3 is an exploded perspective view of the ink jet head according to the embodiment before being fastened.

FIG. 3 is an exploded perspective view of the ink jet head according to the embodiment before being fastened. The aforementioned reference numerals indicate the same elements thereof. The heat sinks 14 and 15 are attached to surfaces that are different from an attachment surface of the plate holder 23 with respect to the printer body. The heat sink 14 is fixed to the left side surface of the plate holder 23, and the heat sink 15 is fixed to the right side surface of the same plate holder 23. Heat shield members having elasticity may be respectively provided between the plate holder 23 and the heat sink 14 and between the plate holder 23 and the heat sink 15. The heat sinks 14 and 15 are fastened to each other by using a screw 54 and bolts 38 and 39. On inner wall surface sides of heat sink plates, the heat sinks 14 and 15 cover the reference plate 13, the plate holder 23, an ink supplying tube 47, and an ink discharging tube 48. The heat sink 14, for example, can be formed from aluminum or other type of molded member. A plurality of fins may be formed on the inner wall surface side of the heat sink 14. The heat sink 15 is the same as the heat sink 14. Where the heat sinks 14 and 15 are attached to each other, the flexible printed circuit board 20 is bent upward from the bottom thereof. First ends of the tubes 47 and 48 are respectively connected to the supply pipe 16 and the discharge pipe 17, and the other ends of the tubes 47 and 48 are respectively connected to pipes 34 and 35.

Figure 4:
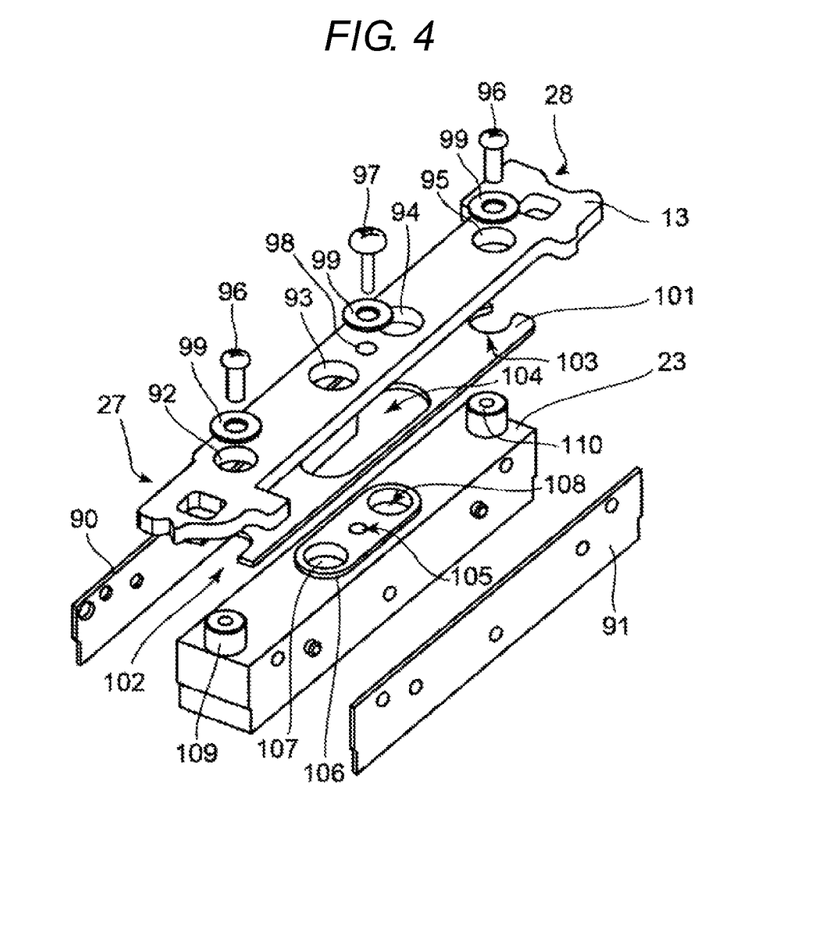
FIG. 4 is a perspective view of a reference plate and a plate holder of the ink jet head of the embodiment, in a single body.
Figure 5:
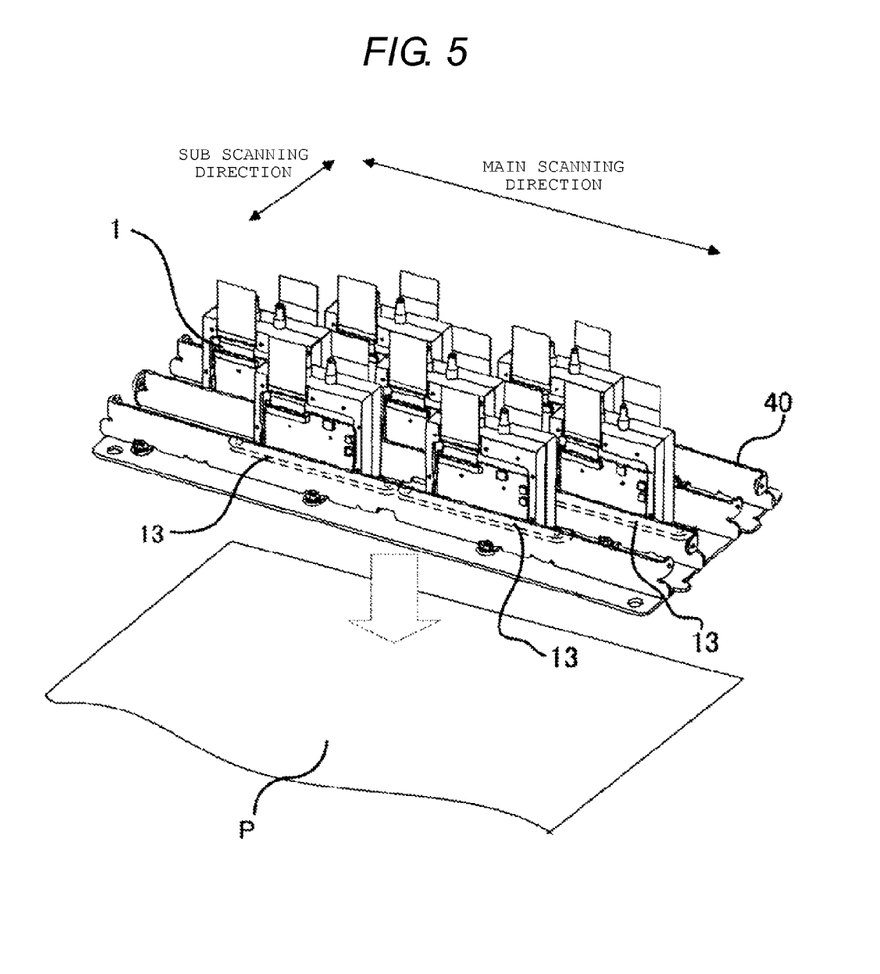
FIG. 5 is a perspective view of a portion of a printer body in which a plurality of the ink jet heads according to the embodiment are provided.

FIG. 4 is a perspective view of the reference plate 13 and the plate holder 23 of the inkjet head of the embodiment, in a single body. FIG. 5 is a perspective view of a portion of the printer body in which a plurality of the ink jet heads according to the embodiment are provided. The aforementioned reference numerals indicate the same elements thereof. The reference plate 13 is a plate that fixes the ink jet head according to the embodiment to the attachment plate 40 (FIG. 5) on the printer body side to perform positioning with respect to the printer body. In the printer body, two or three ink jet heads 1 that are disposed in the main scanning direction are disposed in a sub-scanning direction.

In FIG. 4, the plate holder 23 is fastened to the reference plate 13 at a center portion in the plate length direction. The plate holder 23 is engaged with the reference plate 13 at both end portions in the plate length direction without being fixedly fastened thereto. Therefore, the reference plate 13 is allowed to slightly slip with respect to the plate holder 23. An elastic sheet 101 (e.g., a sheet member having elasticity) may be provided between the plate holder 23 and the reference plate 13. Otherwise, elastic sheets 90 and 91 may be provided on both right and left side surfaces of the plate holder 23.

The reference plate 13 is configured such that both end portions thereof do not deform (for example, by deflecting or bending) when being held by the attachment plate 40. A material having a coefficient of thermal expansion smaller than the coefficient of thermal expansion of aluminum is used for the reference plate 13. For example, the reference plate 13 can be formed of stainless steel or steel. The coefficient of thermal expansion denotes a coefficient of linear expansion, and the coefficient of linear expansion is indicated by an elongation in micrometer-scale when a temperature is increased by 1° C. with respect to a rod body having a length of 1 m. The reference plate 13 is obtained by cutting or punching.

A material having low thermal conductivity is used for the plate holder 23 in order to reduce an amount of heat transferred. For example, a hollow plastic molded member is used therefor. The thermal conductivity denotes a rate of heat transferred between two surfaces having temperatures different from each other and is indicated by a calorific value (W/m·K) transmitted between substances having thicknesses of 1 mm, cross sectional areas 1 m$^2$, and a temperature difference of 1 K, for example. The thermal conductivity of a resin material ranges approximately from 0.1 W/m·K to 1.0 W/m·K, which is a low thermal conductivity as compared to the thermal conductivity of iron (83.5 W/m·K) and stainless steel (ranging between 16.7 W/m·K to 20.9 W/m·K).

The structure of the reference plate 13 and the plate holder 23 is such that the reference plate 13 includes fastening portions 27 and 28 respectively provided at both end portions in the plate length direction thereof, and five penetration holes 92, 93, 94, 95, and 98 provided between the fastening portions 27 and 28 (the fastening portions 27 and 28 are illustrated by suitably changing the shapes). Each of the fastening portions 27 and 28 is fastened to the attachment plate 40 by inserting a bolt through the bolt hole.

A screw 97, a washer 99, an opening 104 of the elastic sheet 101, and a thickness portion 106 and a screw reception portion 105 of the plate holder 23 are positioned in the penetration hole 98, which is center of the five holes. A screw groove may be formed on a screw shaft of the screw 97 and an inner wall of the screw reception portion 105. The reference plate 13 and the plate holder 23 may be fastened to each other by screwing the screw 97 in the screw groove while interposing the elastic sheet 101 therebetween. The penetration holes 93 and 94 respectively allow the pipes 34 and 35 (connection) to be inserted therethrough. Inner walls of the penetration holes 93 and 94 adhere to cylindrical portions of the pipes 34 and 35. Studs 109 and 110, which also serve as spacers, are provided on both sides in the plate length direction on an upper surface of the plate holder 23. The studs 109 and 110 are inserted through the penetration holes 92 and 95 of the reference plate 13 and are engaged by the screw 96 and the washer 99. Since the reference plate 13 is not pressed against the plate holder 23 and is not fastened thereto through the penetration holes 92 and 95, the reference plate 13 is provided with escape spaces for dissipating heat. With respect to an occurrence of thermal expansion in the reference plate 13, the reference plate 13 is prevented from falling off upward and curving, while being prevented from turning. Opening portions 102 and 103 may be provided on both ends of the elastic sheet 101 so as not to abut on the studs 109 and 110.

Figure 6:
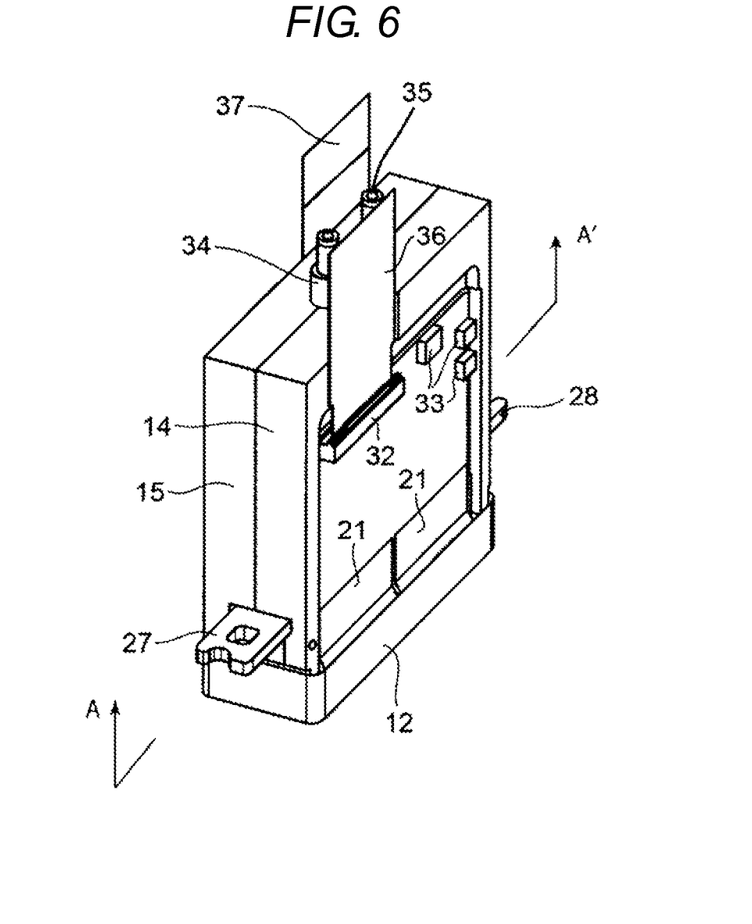
FIG. 6 is a perspective view of the ink jet head according to the embodiment after being assembled.

FIG. 6 is a perspective view of the ink jet head according to the embodiment after being assembled. The aforementioned reference numerals indicate the same elements thereof. Where the heat sinks 14 and 15 are erected so as to face each other, the driver ICs 21 come into close contact with lower portions on rear surfaces of the heat sinks 14 and 15, and thus heat is transferred from each of the driver ICs 21 to the heat sinks 14 and 15. The ink jet head exchanges signals with the controller on the printer body side through cables 36 and 37.

Figure 7:
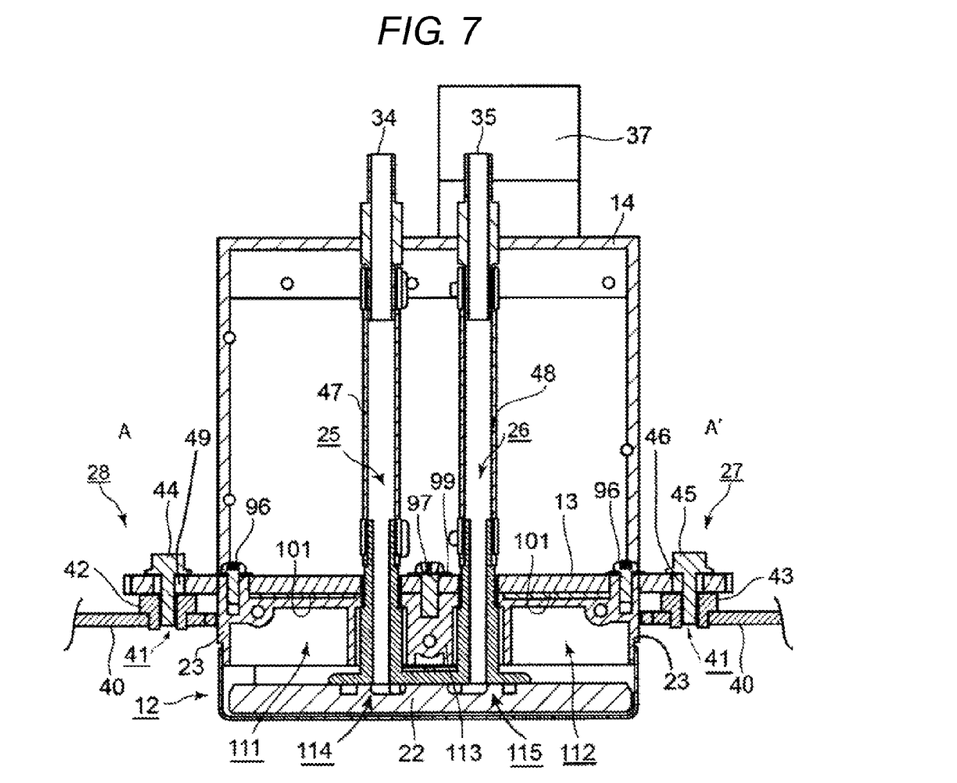
FIG. 7 is a longitudinal sectional view of the ink jet head according to the embodiment.

FIG. 7 is a longitudinal sectional view of the ink jet head according to the embodiment taken along line A-A' in FIG. 6. The aforementioned reference numerals indicate the same elements thereof. The fastening portion 28 on the left side of the reference plate 13 includes a stud 42 that is embedded into a bolt hole 41 on the attachment plate 40 side, is erected on the attachment plate 40, and also serves as the spacer. The fastening portion 28 also includes a bolt 44 that is screwed to the stud 42, and a bolt hole 49 having a hole diameter greater than a bolt diameter of the bolt 44. The fastening portion 27 on the right side includes a stud 43 that is embedded into a bolt hole 41 on the right side, and also serves as the spacer. The fastening portion 27 on the right side also includes a bolt 45 and a bolt hole 46. The plate holder 23 has relief spaces 112 and 111 respectively provided on the right and left, a screw reception portion 113 provided at a center portion between the relief spaces 112 and 111, and connection portions 114 and 115 forming flow channels 25 and 26 between the screw reception portion 113, the supply pipe 16, and the discharge pipe 17 and the tubes 47 and 48.

Operational movements of the ink jet head according to the embodiment having the above-described configuration will be described. With respect to ejection, the drive circuit 18 receives drive signals from the printer body. Any of the driver ICs 21 generates pulse voltage signals to cause an electric field, thereby deforming the side walls of the pressure chambers inside the head body 11. In the head body 11, the capacity of the pressure chambers expands and contracts to pressurize an ink, and thus the head body 11 ejects a liquid droplet from the ejection port 51. Heat generated in the driver ICs 21 when the ink jet head ejects a liquid droplet is transferred to the heat sinks 14 and 15. The heat sinks 14 and 15, and the reference plate 13, continue to dissipate heat.

The fastening portions 27 and 28 are fastened with bolts by strong fastening forces. When a driving period of the drive circuits 18 is short, despite the axis center positions of the bolts 44 and 45 being displaced outward in the longitudinal direction of the reference plate 13 due to heat generation, the positions of the bolts 44 and 45 return to the initial state by being cooled. Therefore, the head body 11 is not deformed to the extent that printing quality is influenced. The reference plate 13 is also elongated in a print-feeding direction orthogonal to the longitudinal direction. However, although the measurement of the plate in the print-feeding direction is elongated, the measurement of the plate returns to the initial state by being cooled. Some elongation can remain that does not cause substantial printing slippage.

Figure 8:
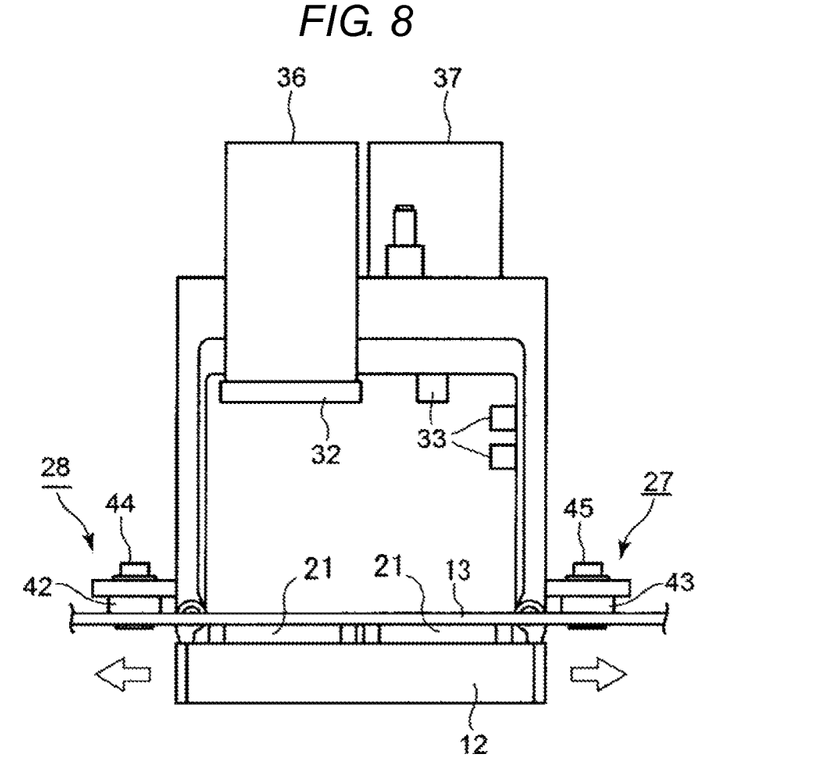
FIG. 8 is a diagram exemplifying a direction of deformation which occurs in the ink jet head according to the embodiment.

FIG. 8 is a diagram exemplifying a direction of deformation that occurs in the ink jet head according to the embodiment. The aforementioned reference numerals indicate the same elements thereof. When the driver ICs 21 radiate heat, since the material of the heat sink is made of aluminum and has high thermal conductivity, the reference plate 13 and the attachment plate 40 transversely (refer to the arrows) expand as illustrated in the drawing by heat transferred from the heat sinks 14 and 15. Where the fastening portions 27 and 28 are fastened with bolts, the reference plate 13 expands outward in the longitudinal direction more than the attachment plate 40 extends through deformation. If the generated heat is not dissipated, position of the ejection port 51 of the head body 11 may be potentially misaligned outward in the longitudinal direction. Without compensating for heat generation, misalignment of the ink jet head with respect to the printer body occurs. Heat generated in the driver ICs 21 passes through the connected metallic portions (connection) such as the heat sinks 14 and 15, the reference plate 13, the supply pipe 16, and the discharge pipe 17 affect the temperature of an ink flowing inside the connection. Therefore, the viscosity of the ink can change, which can affect the printing quality.

In the ink jet head according to the embodiment, the structure illustrated in FIG. 4 and the like is adopted. The attachment portion with respect to the attachment plate 40 is divided into the reference plate 13 and the plate holder 23 to prevent the reference plate 13 from misaligning outward in the longitudinal direction at the time of thermal expansion and to decrease an influence to an ink due to heat generated by the driver ICs 21. The ink jet head is fastened with the fastening members (the screw 97 and the washer 99) at one place in the center portion, which avoids the influence of the heat expansion.

The divided reference plate 13 extends outward in the plate length direction at the time of heat generation. If the fastening portions 27 and 28 on both sides are tightly fastened, both end portions of the reference plate 13 are curved upward due to the heat expansion, thereby causing failure of the screw and causing curving of the reference plate 13. Otherwise, deformation occurs such that moment of force is added to the reference plate 13 in a different direction and a turning force is applied thereto. The ink jet head has a structure in which the screws 96 (the fastening members) at two places on both sides only press the reference plate 13 without fastening in order to prevent failure of the screw and curving, while preventing turning thereof. Therefore, the failure of the screw and curving are prevented while absorbing turning thereof, and thus, the influence of thermal expansion may be suppressed from transferring in the transverse direction.

For example, the coefficient of linear expansion of stainless steel (SUS 410) is $10.4 \times 10^{-6}$ per K, the coefficient of linear expansion of stainless steel (SUS 304) is $17.3 \times 10^{-6}$ per K, and the coefficient of linear expansion of steel ranges from $10 \times 10^{-6}$ per K to $11 \times 10^{-6}$ per K. The coefficients of linear expansion of stainless steel and steel are smaller than the coefficient of linear expansion $23 \times 10^{-6}$ per K of aluminum, and strength of stainless steel and steel is greater than the strength of aluminum. By using the stainless steel or steel, the thermal expansion value of the reference plate 13 may be minimized as much as possible while exhibiting sufficient strength.

If aluminum material having a large coefficient of linear expansion is used as the reference plate 13, the driver ICs 21 cycle between generating heat and cooling-off. Therefore, the elongated amount of the reference plate 13 exceeds the elongated amount of the attachment plate 40. In this case, in the fastening portion 27, the center line of the bolt hole 46 of the reference plate 13 deviates from the axis center of the bolt, and thus the position of the bolt hole 46 in the longitudinal direction deviates from the reference position to the right, that is, outward. The fastening portion 27 deviates in the longitudinal direction that is a direction opposite to the deviation direction of the fastening portion 28. When aluminum is used for the reference plate 13, the reference plate 13 and the heat sinks 14 and 15 are made of the same material. Therefore, heat expansion of the reference plate 13 and the heat sinks 14 and 15 occurs between the fastening portions 27 and 28, and thus stress due to the difference of the elongated amount between the reference plate 13 and the attachment plate 40 is generated inside the reference plate 13.

In contrast, the ink jet head according to the embodiment uses the reference plate 13 made of stainless steel or steel so that no stress occurs due to a difference of the elongated amount between the reference plate 13 and the attachment plate 40 that occurs when aluminum is used. In the ink jet head, the bolt hole 46 has a hole diameter greater than the bolt diameter. When being fastened by the stud 43, the bolt 45 is fastened by being fixed at the lower half of the axis center of the bolt. The bolt hole 49 is configured the same as the bolt hole 46. The difference of the elongated amount between the reference plate 13 and the attachment plate 40 is small. While some difference in elongation can occur, since the hole diameter of the bolt hole 46 is greater than the bolt diameter, the deviation may be absorbed. Therefore, the reference plate 13 may be adjusted on a micron-scale to be precisely fixed to the attachment plate 40 with the bolt.

The divided plate holder 23 illustrated in FIG. 4 is a hollow plastic molded member. When the temperature is near room temperature, for example, thermal conductivity in the air is 0.0241 (W/m·K). Contrary to iron having thermal conductivity of 83.5 W/m·K, and stainless steel having thermal conductivity of 16.7 W/m·K to 20.9 W/m·K, the thermal conductivity of a polymeric resin material ranges approximately from 0.1 W/m·K to 1.0 W/m·K. The plate holder 23 is made with a member having low thermal conductivity. Thus, heat transfer may be minimized since the plate holder 23 fixedly adheres to the cylindrical portions of the metallic supply pipe 16 and discharge pipe 17. The cooling effect may be enhanced since heat is not transferred.

As illustrated in FIG. 5, in a color printer, the attachment plate 40 is provided with five ink jet heads 1 disposed in zigzag-fashion for each color with respect to paper P. The ink jet heads 1 are disposed to cause the center line of the head of the ink jet head 1 at the rear row (or at the front row) to coincide with the bisected position between the center lines of the head of two ink jet heads 1 at the front row (or at the rear row). Between the two adjacent head bodies 11, positions of the ejection ports 51 at each end portion where one head body 11 is adjacent to another head body 11 is adjusted to coincide with each other, thereby being attached to the attachment plate 40. In the embodiment of the ink jet head, on account of the structure in FIG. 4, misalignment of the plurality of head bodies 11 with respect to the printer body side may be prevented with high precision. Moreover, misalignment to the extent that the printing is affected may be prevented.

As described above, in the ink jet head according to the embodiment, according to the structure illustrated in FIG. 4, the attachment portion with respect to the attachment plate 40 is divided into the reference plate 13 and the plate holder 23. The reference plate 13 is prevented from misaligning outward in the longitudinal direction at the time of heat expansion. An influence to an ink due to heat generation is decreased. Since the reference plate 13 is engaged with and fastened to the plate holder 23 at one place in the center portion, the influence of the heat expansion is avoided without causing deformation of the reference plate 13.

The attachment member on the printer body side is a plate (the attachment plate 40). Alternatively, the attachment member can include a frame on the printer body side, a frame body, a holder, an attachment tool, a rod-shaped member, a piece-shaped member, or combinations thereof. The positions of the tubes 47 and 48 for supplying and discharging an ink may be reversed. Furthermore, the heat sinks 14 and 15 may be not only provided with the fins, but also be subjected to surface treatment for widening the surface area. The advantages of the ink jet head according to the embodiment described above can be achieved in these various alternative embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ink jet head comprising:
   a head body including a plurality of ejection ports and a fluid chamber for ink, the plurality of ejection ports being disposed in a nozzle disposition direction;
   a base portion including an ink supply channel and an ink discharge channel communicating with the fluid chamber;
   at least one drive circuit disposed in the base portion and configured to drive the head body for ejection;
   at least one heat sink configured to radiate heat generated by the at least one drive circuit;
   a reference plate having both end portions thereof in a plate length direction configured to be fixed to a structure member on a printer body, the reference plate configured to dissipate heat generated by the at least one heat sink and the at least one drive circuit; and
   a plate holder that has a thermal conductivity lower than a thermal conductivity of the reference plate, positions the head body to cause the nozzle disposition direction thereof to be parallel to a main scanning direction with respect to the reference plate, and couples the at least one heat sink and the base portion to each other.

2. The ink jet head according to claim 1, wherein the plate holder is fastened to the reference plate at a center portion in the plate length direction.

3. The ink jet head according to claim 2, wherein the plate holder is pressed to the plate holder without fastening.

4. The ink jet head according to claim 1, wherein a sheet member having elasticity is provided between the plate holder and the reference plate.

5. The ink jet head according to claim 1, wherein sheet members having elasticity are provided on side surfaces of the plate holder.

6. The ink jet head according to claim 1, wherein the at least one heat sink comprises a pair of heat sinks, the plate holder being interposed between the pair of heat sinks, and
   wherein a heat shield member having elasticity is provided between the plate holder and the pair of heat sinks.

7. The ink jet head according to claim 1,
wherein the base portion includes a base plate and a manifold bonded to the base plate, the manifold including the ink supply channel and the ink discharge channel.

8. The ink jet head according to claim 1,
wherein each of the at least one drive circuit comprises a rigid printed circuit board, a heat-resistant flexible printed circuit board, and a driver integrated circuit.

9. The ink jet head according to claim 1,
wherein the reference plate has a coefficient of thermal expansion less than a coefficient of thermal expansion of aluminum.

10. The ink jet head according to claim 1,
wherein the plate holder comprises a plastic molded member.

11. A printer body, comprising:
an attachment member; and
a plurality of ink jet heads mounted to the attachment plate, each of the plurality of ink jet heads comprising:
 a head body including a plurality of ejection ports and a fluid chamber for ink, the plurality of ejection ports being disposed in a nozzle disposition direction;
 a base portion including an ink supply channel and an ink discharge channel communicating with the fluid chamber;
 at least one drive circuit disposed in the base portion and configured to drive the head body for ejection;
 at least one heat sink configured to radiate heat generated by the at least one drive circuit;
 a reference plate having both end portions thereof in a plate length direction fixed to the attachment member, the reference plate configured to dissipate heat generated by the at least one heat sink and the at least one drive circuit; and
 a plate holder having a thermal conductivity lower than a thermal conductivity of the reference plate, the plate holder positioning the head body to cause the nozzle disposition direction thereof to be parallel to a main scanning direction with respect to the reference plate, and connecting the at least one heat sink and the base portion to each other.

12. The printer body according to claim 11,
wherein the plate holder is fastened to the reference plate at a center portion in the plate length direction.

13. The printer body according to claim 12,
wherein the plate holder is pressed to the plate holder without fastening.

14. The printer body according to claim 11,
wherein a sheet member having elasticity is provided between the plate holder and the reference plate.

15. The printer body according to claim 11,
wherein sheet members having elasticity are provided on side surfaces of the plate holder.

16. The printer body according to claim 11,
wherein the at least one heat sink comprises a pair of heat sinks, the plate holder being interposed between the pair of heat sinks, and
wherein a heat shield member having elasticity is provided between the plate holder and the pair of heat sinks.

17. The printer body according to claim 11,
wherein the base portion includes a base plate and a manifold bonded to the base plate, the manifold including the ink supply channel and the ink discharge channel.

18. The printer body according to claim 11,
wherein each of the at least one drive circuit comprises a rigid printed circuit board, a heat-resistant flexible printed circuit board, and a driver integrated circuit.

19. The printer body according to claim 11,
wherein the reference plate has a coefficient of thermal expansion less than a coefficient of thermal expansion of aluminum.

20. An ink jet head comprising:
a head body including a plurality of ejection ports and a fluid chamber for ink, the plurality of ejection ports being disposed in a nozzle disposition direction;
a base portion including an ink supply channel and an ink discharge channel communicating with the fluid chamber;
a reference plate having both end portions thereof in a plate length direction configured to be fixed to a structure member on a printer body; and
a plate holder fastened to the reference plate, the plate holder having a thermal conductivity lower than a thermal conductivity of the reference plate, the plate holder positioning the head body to cause the nozzle disposition direction thereof to be parallel to a main scanning direction with respect to the reference plate.

* * * * *